United States Patent [19]

Schutz et al.

[11] Patent Number: 4,584,672
[45] Date of Patent: Apr. 22, 1986

[54] CMOS DYNAMIC RANDOM-ACCESS MEMORY WITH ACTIVE CYCLE ONE HALF POWER SUPPLY POTENTIAL BIT LINE PRECHARGE

[75] Inventors: Joseph D. Schutz, Portland; Roger I. Kung, Beaverton, both of Oreg.

[73] Assignee: Intel Corporation, Santa Clara, Calif.

[21] Appl. No.: 582,526

[22] Filed: Feb. 22, 1984

[51] Int. Cl.⁴ .............................................. G11C 7/00
[52] U.S. Cl. ..................................... 365/203; 365/205
[58] Field of Search ............... 365/189, 190, 202, 203, 365/205, 207, 210

[56] References Cited

U.S. PATENT DOCUMENTS

| | | | |
|---|---|---|---|
| 4,070,590 | 1/1978 | Ieda et al. | 365/205 X |
| 4,262,342 | 4/1981 | Twan | 365/203 |
| 4,351,034 | 9/1982 | Eaton, Jr. et al. | 365/189 |
| 4,451,906 | 5/1984 | Ikeda | 365/205 |

FOREIGN PATENT DOCUMENTS

| | | |
|---|---|---|
| 0077934 | 5/1983 | European Pat. Off. . |
| 1374215 | 11/1974 | United Kingdom . |
| 1567149 | 5/1980 | United Kingdom . |
| 2053612 | 2/1981 | United Kingdom . |

OTHER PUBLICATIONS

D. P. Spampinato, "Differential Sense Amplifier", IBM Tech. Disclosure Bulletin, vol. 17, No. 6, Nov. 1974, pp. 1797–1798.

Primary Examiner—Joseph A. Popek
Attorney, Agent, or Firm—Blakely, Sokoloff, Taylor & Zafman

[57] ABSTRACT

A CMOS dynamic RAM is described which uses multiplexing to selectively couple two pairs of bit lines to a single sense amplifier. Both pairs of bit lines are decoupled from the sense amplifier after a word line selects a cell and before sensing occurs in the sense amplifier. Only one pair of bit lines is coupled to the input/output lines of the memory. No dummy cells are employed. The bit lines are charged to one-half the power supply potential. Restoration of potentials on each pair of bit lines occurs at different times, thereby reducing the peak currents to the RAM.

23 Claims, 6 Drawing Figures

ARCHITECTURE OF DRAM

CMOS DYNAMIC RANDOM-ACCESS MEMORY WITH ACTIVE CYCLE ONE HALF POWER SUPPLY POTENTIAL BIT LINE PRECHARGE

BACKGROUND OF THE INVENTION

1. Field of the Invention

The invention relates to the field of semiconductor dynamic memories.

2. Prior Art

Metal-oxide-semiconductor (MOS) and complementary MOS (CMOS) dynamic random-access memories (DRAMs) continue to increase in density from, for example, the 1K memories of the late 1960's to the currently used 64K memories of today. The described invention is realized in a 256K CMOS memory, although the inventive concepts described may be utilized in other size memories.

In DRAMS, typically memory cells each of which include a single transistor and capacitor, are coupled to bit lines. Pairs of bit lines extend from a latch-like sense amplifier. Dummy cells, restore circuits, and architecture employing folded bit lines are commonly used in current DRAMs.

The capacity of an MOS DRAM can, of course, be increased by employing more memory cells. But unless higher density fabrication is used, that is, smaller cells, etc., the higher capacity memories are not suited for high volume production because the increased substrate area decreases yields. There is, thus, always the continuing goal to shrink the size of the memory cells. However, as the cells are made smaller, they store less charge and it becomes increasingly difficult to sense the binary state stored in the cells. It is easier to sense a smaller cell if the bit line capacitance is reduced and this can be achieved with fewer cells on the bit lines allowing them to be shortened. On the other hand, where greater array effeciency is sought, it is helpful if more cells are placed along each of the bit lines. Using shorter bit lines require more sense amplifiers, consequently, some of the increased density gained by using smaller cells with shorter bit lines can be lost because of the additional sense amplifiers and related peripheral circuit (e.g., decoders).

One prior art suggestion, although not commercialized, is to multiplex pairs of bit lines to a single sense amplifier. This technique, in theory, permits use of the shortened bit lines without requiring additional sense amplifiers. The present invention employs this technique, but not in the manner used in the prior art. For instance, with the present invention, as will be seen, there is a decoupling of the bit lines from the sense amplifier when sensing occurs.

In some prior art DRAMs, bit lines are precharged to the full power supply potential, for example, five volts. In others, the bit lines are charged to a reference potential such as half the power supply potential. These precharging techniques are used both with and without dummy cells. An obvious advantage to charging to one-half the power supply potential is that the memory consumes less power. However, there are a number of problems with this system. In one case, the bit lines are precharged during an inactive cycle. The power supply potential can vary between the time of the precharging and the actual sensing and this variation causes difficulty in sensing. Another problem with precharging the bit lines to half the power supply potential is that poor performance results when the power supply potential is low. With the described invention, the bit lines are charged to half the power supply potential in a unique way and in combination with the multiplexing mentioned above. Not only is less power consumed, but also the peak currents are reduced with the present invention.

For recent discussions of DRAM technology, see (1) "A 90NS 256K×1B DRAM With Double Level AL Technology", *ISSCC Digest of Technical Papers* pages 226–227, Feb. 1983, by Fujii, T. et al; (2) "A 64 Kb CMOS RAM", *ISSCC Digest of Technical Papers* pages 258,259, Feb. 1982, by Konishi, S. et al, (3) "A 70NS High Density CMOS DRAM", *ISSCC Digest of Technical Papers* pages 56–57, Feb. 1983, by Chwang, R. et al; (4) "A 100 ns 5 V Only 64K×1 MOS Dynamic RAM", *IEEE Journal of Solid-State Circuits* pp. 839–845, Vol. SC-15, No. 5. Oct. 1980 by Chan, J. et al; and (5) "A 5V-Only 64K Dynamic RAM Based on High S/N Design", *IEEE Journal of Solid-State Circuits* p. 846, Vol. SC-15, No. 5, Oct. 1980 by Masuda, H. et al.

SUMMARY OF THE INVENTION

A metal-oxide-semiconductor (MOS) dynamic random-access memory (DRAM) is described. The memory includes a first and a second plurality of memory cells associated with a sense amplifier. A first pair of bit lines are coupled to the first cells and a second pair of bit lines are coupled to the second cells. A first switching means permits selective coupling of the first pair of the bit lines to the sense amplifier and a second switching means permits the selective coupling of the second pair of bit lines to the sense amplifier. Precharging means and a restore circuit are also coupled to each pair of bit lines. One of the first or second pair of bit lines is coupled through its respective switching means to the sense amplifier when a memory cell is selected along that pair of lines. The switching means decouples the selected pair of bit lines from the sense amplifier when the sense amplifier begins to sense the data from the memory cell.

In the currently preferred architecture, the input/output lines in the memory array are coupled to only one pair of the bit lines. The first and second switching means are used to transfer data from one pair of bit lines to the other to allow the coupling of data to the input/output lines.

Another unique aspect of the present invention is that the restore circuits are separately activated for each pair of bit lines and are deactivated during writing. Other aspects of the present invention are set forth in the detailed description.

DETAILED DESCRIPTION OF THE INVENTION

A metal-oxide-semiconductor (MOS) dynamic random-access memory (DRAM) is described. In the following description, numerous specific details are set forth such as specific arrays, number of cells, etc. It will be obvious to one skilled in the art that the present invention may be practiced without these specific details. In other instances, well-known circuits associated with DRAMs such as decoders, etc., are not illustrated in order not to unnecessarily obscure the present invention.

OVERVIEW OF PREFERRED EMBODIMENT

In the currently preferred embodiment, the DRAM is fabricated employing CMOS technology. In particular, the array is fabricated in an n-well using double polycrystalline silicon (polysilicon) technology. The n-well-/substrate junction is reverse biased and acts as a minority carrier barrier which reduces soft errors induced by alpha particles. The overall structure of the cell is shown in copending application, entitled "CMOS DRAM", Ser. No. 470,454, filed Feb. 28, 1983, and assigned to the assignee of the present invention. The on chip power distribution for the disclosed memory is described in copending application Ser. No. 581,285, filed Feb. 17, 1984, entitled "POWER DISTRIBUTION FOR CMOS CHIP", and assigned to the assignee of the present application.

In the currently preferred embodiment, the memory is organized as a 256K×1 memory. Gate oxide thicknesses (second layer of polysilicon) of 250 A are used. The cells have an area of approximately 70 $\mu m^2$ with a storage capacitance of approximately 55 fF. The word line drivers employ a negative "boosted" potential which yields an average cell stored charge of approximately 275 fC. The bit line to cell capacitance ratio is approximately 12-to-1 providing a 190 mV signal for sensing over a wide operating range. The memory operates from a five volt potential and draws an average current of 45 mA and a standby current of 1 mA. A 256 cycle refresh arrangement is used at intervals of 4 mS. The substrate on which the entire memory is fabricated includes four redundant rows and columns.

Access times of less than 100 ns. are obtained with row accessing. The memory employs static column circuits, thus permitting a faster "Ripplemode" (a static column mode) access where 512 bits can be accessed with an access time of approximately 40 nS. per bit and with a reduced active current of approximately 25 mA.

ARCHITECTURE OF PREFERRED EMBODIMENT

Figure 1:
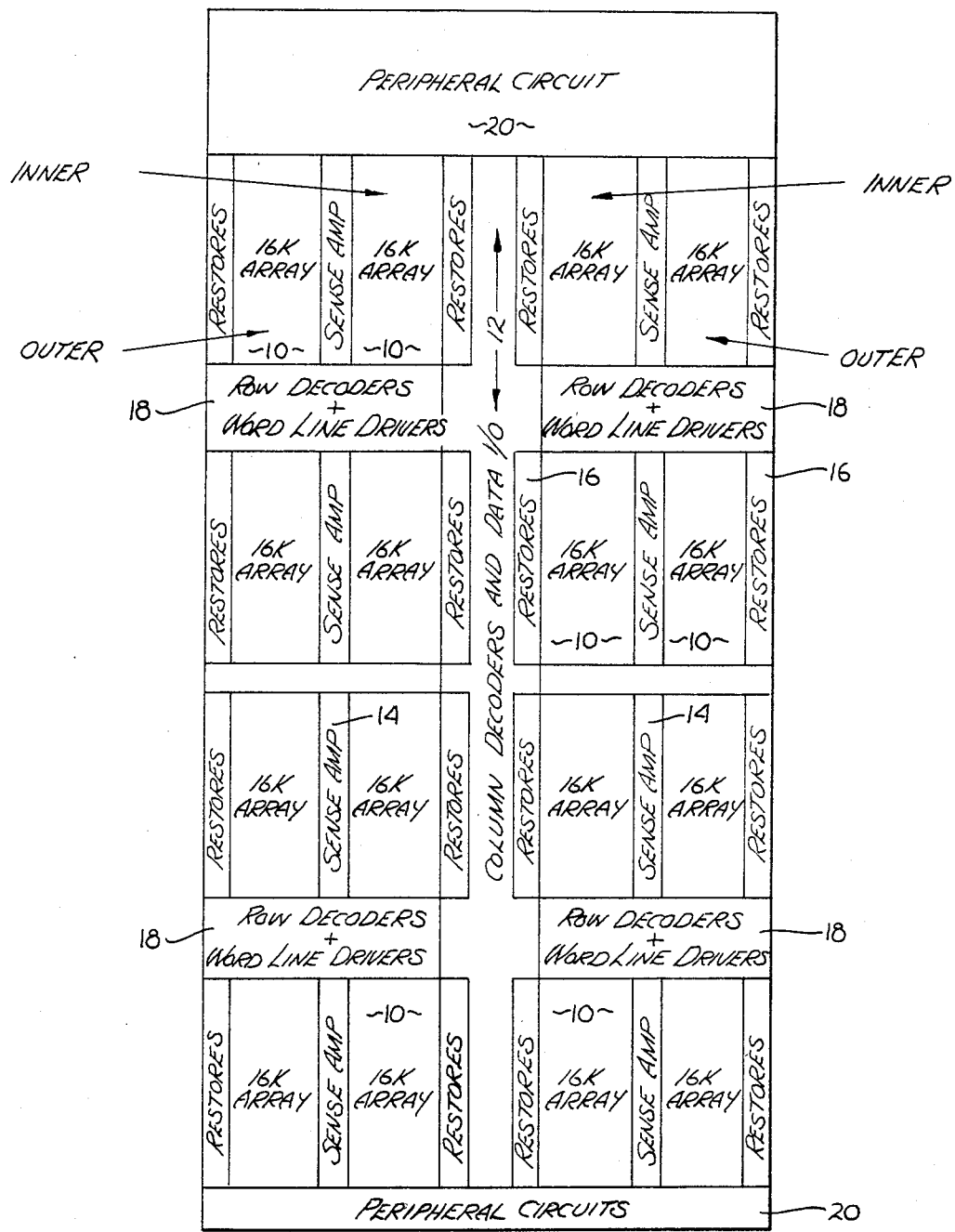
FIG. 1 is a plan view of the invented memory used to describe the general architecture.
Figure 2:
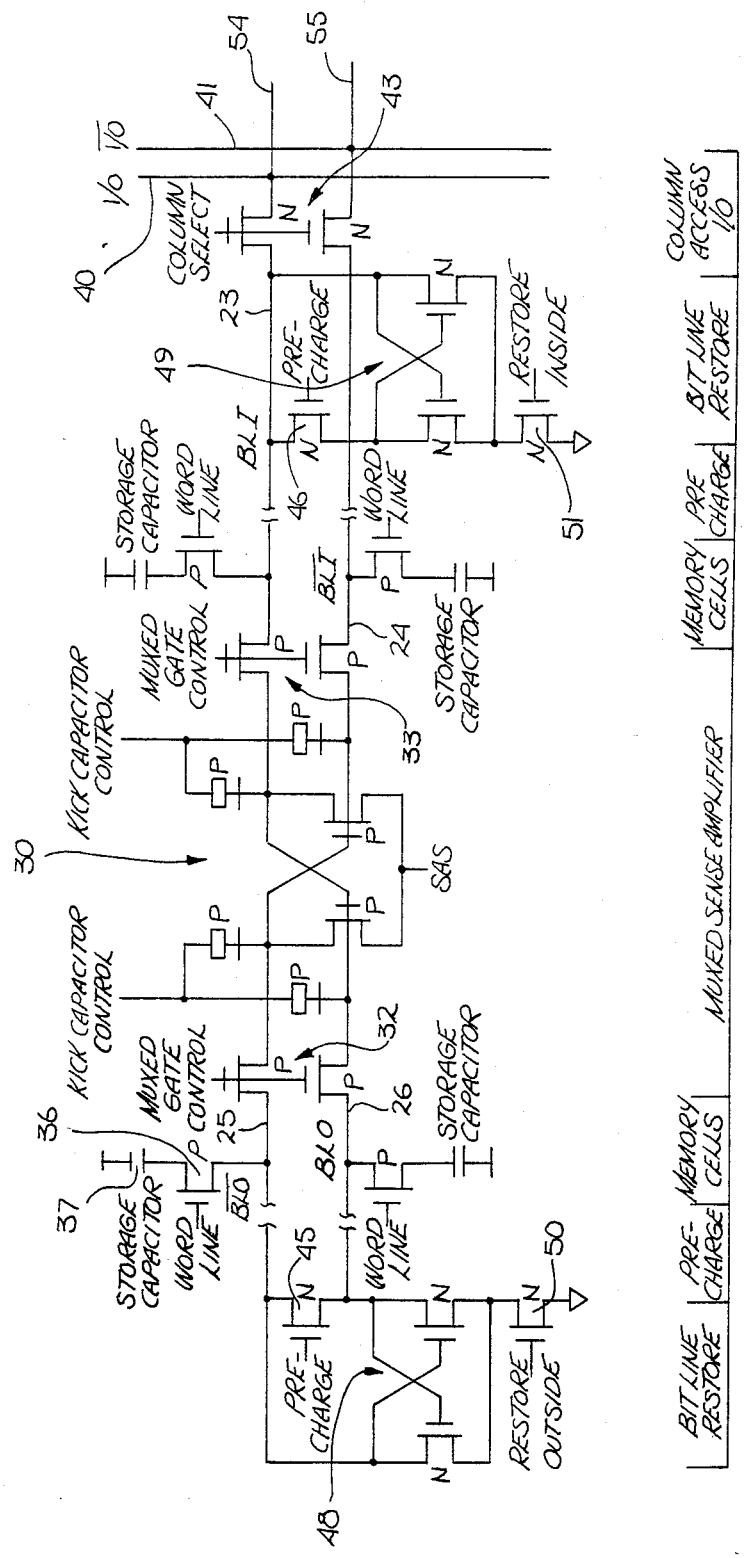
FIG. 2 is an electrical schematic of the presently preferred memory cell, bit lines, sense amplifier, restore circuits, multiplexing means and interconnection of the bit lines to the input/output lines.

The 256K×1 organization is realized in the presently preferred embodiment with 16K arrays 10 as shown in FIG. 2. The arrays 10 are paired and each pair is separated by a row of sense amplifiers 14. The restore circuits 16 are formed in rows generally parallel to the sense amplifiers at the outer edges of each pair of arrays 10. The column decoders and data input/output lines are formed in the elongated central portion 12 of the memory. All data transferred into and from the arrays occurs through these centrally disposed input/output lines. The outer arrays communicate with the input-/output lines through the bit lines of the inner arrays as will be described in detail in conjunction with FIG. 2.

The row decoders and word line drivers 18 are formed in two horizontal bands. Dual row decoders are used in these bands. The peripheral circuits, for the most part, are located in the regions 20. These include the input/output buffering for data, the buffering for addresses and timing signals such as the standard RAS-/and CAS/ signals. As is commonly done, these buffers provide TTL to MOS signal level shifting.

SENSE AMPLIFIER MULTIPLEXING AND RESTORE CIRCUITS

In FIG. 2, two pairs of bit lines, lines 23 and 24, and lines 25 and 26, are selectively coupled to the sense amplifier 30 through transistors 33 and 32, respectively. The bit lines 23 and 24 are connected to the complementary input/output lines 40 and 41 through transistors 43. These transistors are selected by the column decoders. This technique is popularly known as multiplexing. For purposes of explanation, the bit lines 23 and 24 are referred to as the inside bit lines (BLI and BLI/) and the bit lines 25 and 26 as the outside bit lines (BLO and BLO/). The designation inside and outside represents the bit line pairs' position relative to the input/output lines and sense amplifier 30. (Note the designation "left" and "right" may create ambiguities since the left and right lines would be reversed for the two pairs of bit lines extending to the other side of the input/output lines 40 and 41, shown as lines 54 and 55.) The sense amplifier 30 includes a pair of cross coupled p-type transistors and four capacitors formed from p-channel transistor-like structures. The amplifier receives a sense amplifier strobe (SAS) signal as is commonly used with DRAM sense amplifiers. The operation of the sense amplifier is discussed in detail in conjunction with FIG. 4.

A plurality of cells is connected to each of the bit lines, each cell comprises a transistor such as transistor 36 and a storage capacitor such as capacitor 37. Word lines in the array select a single capacitor for coupling to one of the bit lines (of one pair) for reading, writing or refreshing. Note no dummy cells are employed along the bit lines.

Transistors 45 and 46 receive the precharge signal and provide for precharging of the bit lines. In typical operation, after restoration, one bit line is at the full power supply potential (five volts) and the other at ground. Thus, lines 24 and 25 may be at five volts and lines 23 and 26 at ground. The precharging signal causes transistors 45 and 46 to conduct, the charge on the bit line pairs is divided and the bit lines are brought to approximately half the power supply potential, for instance, 2½ volts if the power supply potential is a full five volts. Since the bit lines are only changed to ½ the supply potential the active power is reduced by approximately a factor of 2. During this precharging, transistors 32 and 33 conduct, assuring that the nodes within the sense amplifier are also precharged to this one half $V_{CC}$ potential. (In actuality, the bit lines are above 50% of the power supply potential (e.g., at 55%). There is some inherent bootstrapping which occurs from the restore circuits and also the capacitance associated with the junctions is non-linear (e.g., function of voltage). This variation from the 50% figure is process dependent.)

A restore circuit 48 is coupled to the ends of the bit lines 25 and 26 and similarly, a restore circuit 49 is coupled to the ends of the bit lines 23 and 24. Each of the restore circuits comprises a pair of cross coupled n-type transistors. The restore circuit 48 includes transistor 50 which couples the cross coupled transistors to ground. Similarly, the restore circuit 49 includes transistor 51 which couples the pair of cross coupled transistors in circuit 49 to ground. As will be described in detail, transistors 50 and 51 permit the restore circuits 48 and 49 to be separately activated. This distributes the current consumed for restoring the bit lines into separate periods, thus limiting the peak current. Also, the waveforms used to activate the transistors 50 and 51 cause these transistors to conduct gradually, further reducing current peaks.

GENERAL OPERATION OF THE CIRCUIT OF FIG. 2

Before referring to the detailed timing diagram, it will be helpful to have a general understanding of the operation of the circuit of FIG. 2. The circuit operates differently depending upon whether data is being read from the inside bit lines or outside bit lines.

Assume first that data is to be read from one of the outside bit lines, for example, from the cell comprising transistor 36 and capacitor 37. Initially, both transistor pairs 32 and 33 conduct, and the precharging transistors 45 and 46 also conduct. This causes the sense amplifier nodes and both pairs of bit lines to be held at the same potential, approximately $\frac{1}{2} V_{CC}$. Next, transistors 33 and the precharging transistors 45 and 46 are turned off. The word line is then selected, causing transistor 36 to conduct and line 25 to be either additionally charged, or the charge on the line is reduced. (Capacitor 37 stores a full potential (e.g., 5 V or 0 V). An imbalance is caused by the charge from capacitor 37 on the metal bit line 25 and the nodes of the sense amplifier 30. Now transistors 32 are turned off and sensing within the sense amplifier 30 occurs. Importantly, this sensing occurs with neither pair of bit lines being connected to the sense amplifier. After sensing occurs, transistors 33 conduct. The amplified data from the capacitor 37 is thus transferred onto the inside bit lines where it can be transferred to the I/O lines 40 and 41. (The specific timing is discussed later for these events.) A restore signal is applied to transistor 51 to restore the inside bit lines. Transistors 32 are also caused to conduct again so that the data sensed by the sense amplifier 30 is transferred onto the outside bit lines. The outside restore circuit 48 is activated by the application of a signal to transistor 50 restoring the outside bit lines, thereby returning capacitor 37 to its original state.

Therefore, when data is sensed on an outside bit line, it is first transferred onto an inside bit line for coupling to the input/output lines. The inside bit lines are restored first, followed by the restoration of the outside bit lines.

Assume now that data is to be sensed along the inside bit line 24. Once again, initally both transistors 32 and 33 are on, and when the transistors 45 and 46 conduct, all the bit lines and the nodes of the amplifier 30 are brought to approximately $\frac{1}{2} V_{CC}$. After the precharge signal goes low, transistors 32 are turned off and the word line is activated, causing charge to flow onto or from the bit line 24. Then, transistors 33 are turned off and sensing occurs within the amplifier 30 by application of the (SAS). When transistors 33 are again turned on, the data is transferred onto lines 40 and 41 as transistors 43 conduct (after restoring the potential on these lines.) The inside bit lines are restored first. Later, transistors 32 are also permitted to conduct, allowing the outside restore circuit 48 to operate as part of precharge cycle.

As was the case with sensing from outside bit lines, the inside bit lines are isolated from the sense amplifier before data from one of these lines is sensed by the sense amplifier. Similarly, one pair of bit lines are restored at a different time than the other pair of bit lines to assure that the current peaks are reduced.

As is apparent from FIG. 2, the sense amplifier and cells are all p-channel devices. The cells are fabricated in n-wells spaced-apart from the wells containing the sense amplifiers. The restore circuits and column select transistors are n-channel transistors and are fabricated outside the n-well, in the p-type substrate. (The n-well itself is connected to the positive power supply potential.) By way of example, the full power supply potential of $V_{CC}$ is placed across capacitor 37 assuming that the circuit 48 is set to charge capacitor 37. The word lines are bootstrapped (driven negatively approximately 3 volts below ground potential) to assure complete transfer of charge onto and from capacitor 37 and like capacitors. A full $V_{CC}$ potential is applied to one bit line while the other is connected to ground during restoring. (Full $V_{CC}$ is obtained from the SAS signal and ground from circuits 48 and 49.)

Decoders are employed to examine each address and determine which ones of the transistors 32 and 33 are to remain coupled to the sense amplifier after the precharge and prior to the sensing. Such decoders are well-known and may be similar to those used for activating dummy loads, or dummy cells, in prior art DRAMs.

It should be noted that since the bit lines are charged to approximately $\frac{1}{2} V_{CC}$, there is no difficulty transferring charge over transistors 32 and 33.

WAVEFORMS OF FIG. 3

Figure 3:
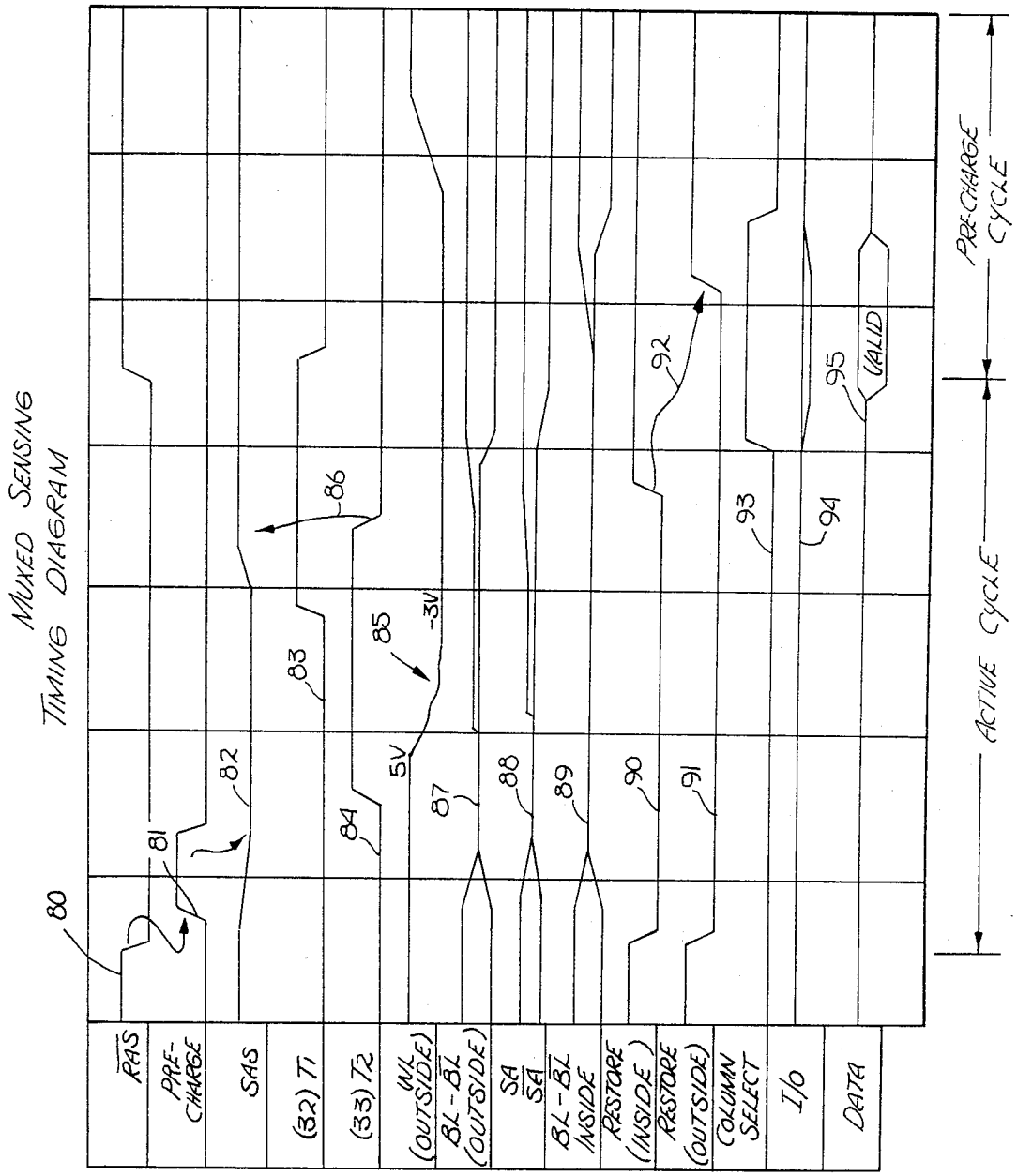
FIG. 3 are timing diagrams used to describe the operation of the circuit of FIG. 2.

Referring to FIG. 3, at the beginning of the active cycle, the row address strobe signal (RAS/) as shown by waveform 80, drops in potential. This initiates an active memory cycle. Following the RAS/ signal's drop in potential, precharging occurs. This is indicated by the waveform 81. Unlike prior art memories, precharging occurs during the active cycle. This does not add to access time since decoding of addresses, etc. is accomplished during this precharging. This assures that the precharge potential is referenced to the current $V_{CC}$. Note that the sense amplifier's strobe signal is on until the precharging occurs and then drops as shown by waveform 82.

In FIG. 3, the waveform coupled to the gates of transistors 32 is shown as T1 and for transistors 33 as T2. Waveforms 83 and 84 are for sensing data on an outside bit lines. Initially both sets of transistors 32 and 33 are conducting then transistors 33 are turned off, followed by transistors 32. Transistors 33 are turned on after sensing occurs as indicated by the line 86, and sometime later, transistors 32 are then turned on.

The word line potential drops to approximately −3 volts as shown by waveform 85 to fully transfer charge from a cell. For the outside bit line sensing shown, the potentials on these bit lines are shown by waveforms 87. Initially, one line is at five volts and the other at ground, then during the precharge period, both are brought to one-half $V_{CC}$. One line changes potential slightly when the word line is activated, the other remains at one-half $V_{CC}$.

The potentials on the sense amplifier nodes are shown by waveforms 88. Once again, one of these potentials are initially at $V_{CC}$ and the other at ground. After precharge, the nodes are equalized and there is a slight change on one mode before sensing begins. Sensing occurs when the SAS signal rises in potential. Waveforms 89 represent the potentials on the inside bit lines. Note that as previously discussed, even though a cell is selected on one of these bit lines, they are not restored until after the active cycle as indicated by the rise in potential in waveform 91, the restore signal for the outside restore circuit. Waveform 90 illustrates that the inside restore occurs first and line 92 shows the separation in time between the inside and outside restoring. The column selection signal rises in potential as shown by waveform 93 shortly after the inside restore signal rises in potential. Thus, the differential on the inside bit lines will be a full $V_{CC}$. The data on the I/O lines is indicated by waveforms 94; and, waveforms 95 illustrates when the data is valid.

All of the above waveforms may be generated with well-known circuits commonly used in DRAMs. For this reason, the timing circuits have not been shown.

The timing signals for sensing on inside bit lines are substantially the same as those of FIG. 3 with the differences discussed above, particularly the timing for transistors 32 and 33.

In the presently preferred embodiment, during a write cycle, no restore circuits are used. They are temporarily deactivated. The bit lines are driven directly from the input/output lines shown in FIG. 2. This speeds up the writing cycles. In the prior art, the restore circuits are activated since there is no way of decoupling them. With the present invention, these circuits can be selectively activated as they are during a read/-restore cycle and also, both circuits can be left deactivated as they are during a write cycle.

SENSE AMPLIFIER OF FIG. 4

Figure 4:
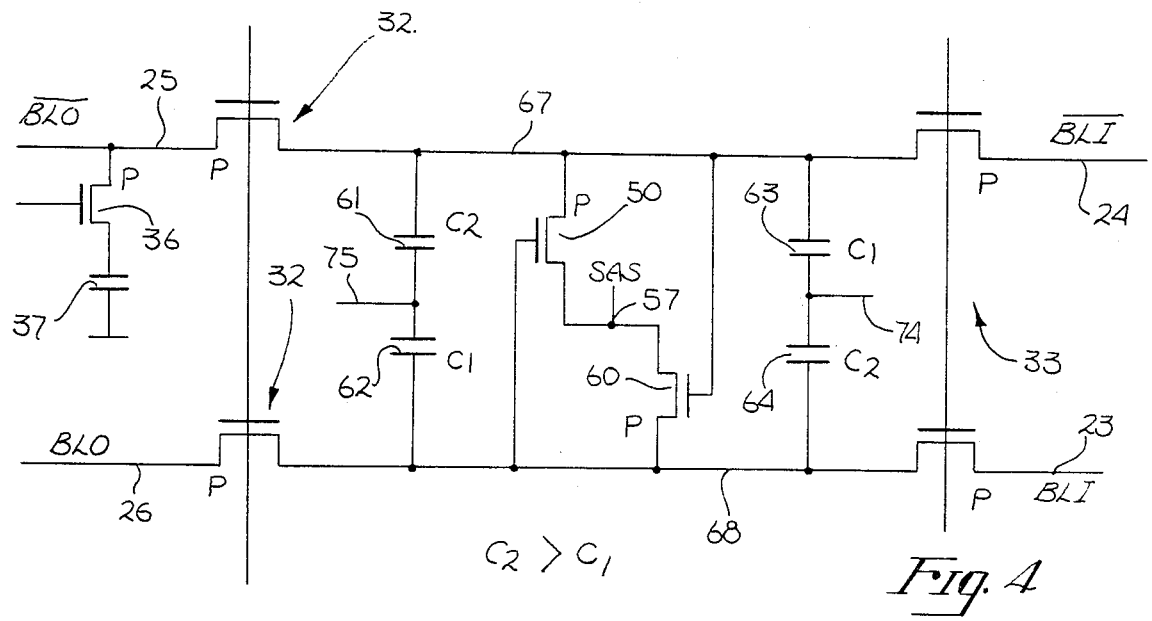
FIG. 4 illustrates the sense amplifier of FIG. 2 redrawn for purposes of explanation.

The sense amplifier of FIG. 2 has been redrawn in FIG. 4 so that both the true and complementary bit lines (both inside and outside) are shown on the same level. Capacitors 61 and 62 are coupled between the nodes 67 and 68 and similarly, capacitors 63 and 64 are coupled between these nodes. The p-channel transistor 50 is coupled between nodes 67 and the node 57 (source of the SAS signal). Its gate is coupled to node 68. Transistor 60 has its gate coupled to node 67, one of its terminals is coupled to node 68 and the other terminal to node 57.

For reasons that will be explained, capacitors 61 ($C_2$) and 64 ($C_2$) have the same capacitance and capacitors 62 ($C_1$) and 63 ($C_1$) also have the same capacitance. The capacitance of $C_2$ is slightly larger than the capacitance of $C_1$, by approximately 5% in the presently preferred embodiment (the specific difference of 5% is not crucial to the present invention).

Ideally, when sensing either a binary one or a binary zero, the swing on the bit line should be the same, although in opposite directions. There are a number of effects which prevent this ideal condition. For instance, when the negative potential is applied to the word line, the capacitive coupling between the word line and bit line (e.g., gate of transistor 36 and line 25 of FIG. 2) brings the bit line more negative. Also, the bit line capacitance is not linear with respect to voltage for a number of reasons such as the parasitic capacitance associated with the source and drain regions of transistors 32 and 33. Another effect previously discussed is that the actual precharge potential on the bit lines is not precisely $V_{CC}/2$. The capacitance of the cells themselves is also not linear with respect to voltage. There are other effects which cause deviation from the ideal condition and which make it difficult to sense data particlarly as the cell size is reduced.

Figure 5:
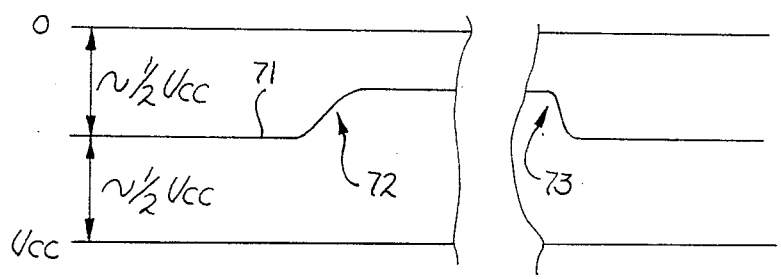
FIG. 5 is a diagram used to describe potential levels in the circuit of FIG. 4.

Briefly in FIG. 5, line 71 represents the ideal voltage on the bit lines after precharging. The swing of this line in the more negative direction at section 72 indicates the pull on one of the bit lines which occurs when the word line is activated. (The charge from the cell is being ignored for this explanation.)

The capacitors 61 through 64 provide compensation for the above-described effects among others. From ordinary decoding of the address signals, it can be determined if a cell is to be accessed on either a true bit line or a complementary bit line. Assume that a cell along line 25 is to be accessed. A potential is applied to line 74 (not line 75). Since capacitor C2 is larger than capacitor C1, line 67 is driven less negatively providing compensation for the above-described effects. This is shown by 73 in FIG. 5. Similarly, if a cell is selected along the true bit lines 23 or 26, the signal is applied to line 75 causing line 68 to be higher in potential than the other bit line providing like compensation.

The capacitors discussed above permit more precise adjustment than can be obtained from using dummy cells, especially where smaller cells are employed. Additionally they provide a D.C. offset which improves gain and compensation in both directions.

REDUCTION IN CURRENT PEAKS

Figure 6:
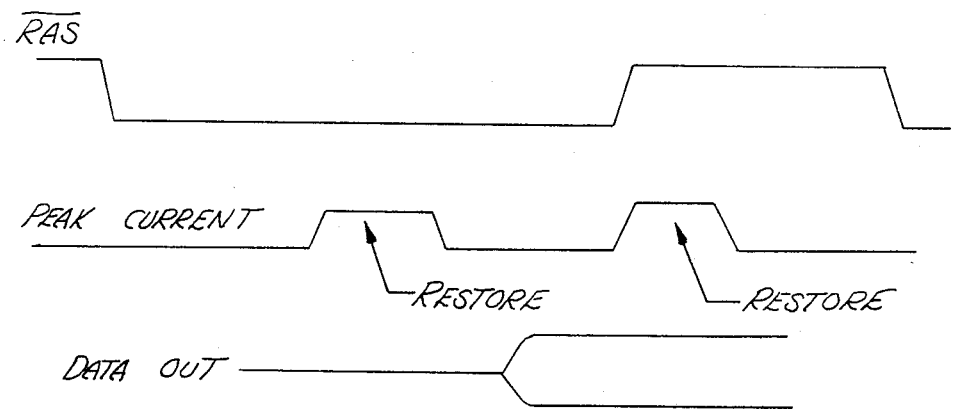
FIG. 6 are waveforms used to describe current peaks with the invented memory.

In FIG. 6, three waveforms are shown to illustrate the distribution of current that occurs since half the array is restored at one time and the other half at another time. Once again, the RAS/ signal is shown dropping in potential; this initiates an active cycle. During the active cycle, and before the data is valid, restoration of half the bit lines occurs. Later, and in fact, during a precharge cycle (after RAS/ rises in potential) the other half of the bit lines are restored. This reduces peak currents and distributes these large current demands into two separate periods. Also, while not shown in detail in FIG. 3, the signals used to activate the restore circuits are ramped. This further reduces the peak current during both restore cycles. These techniques reduce peak currents without adding to access time.

Thus, a CMOS dram has been described which employs two pairs of bit lines multiplexed onto a single sense amplifier. No dummy cells are employed in the described memory. The bit lines are charged to one-half the voltage supply potential. Peak currents are reduced since half the bit lines are restored during one period of time and the other half are restored during another period of time.

We claim:

1. A metal-oxide-semiconductor (MOS), dynamic random-access memory (DRAM) comprising:
   a first and a second plurality of memory cells;
   a sense amplifier;
   a first pair of bit lines, coupled to said first cells;
   a first switching means for selectively coupling said first pair of bit lines to said sense amplifier, said first switching means being coupled to said first bit lines and said sense amplifier;
   a second pair of bit lines, coupled to said second cells;

a second switching means for selectively coupling said second pair of bit lines to said sense amplifier, said second switching means being coupled to said second bit lines and said sense amplifier;

precharging means for precharging said first and second pairs of bit lines, said precharging means for coupling said pairs of bit lines together to equalize the potential on said bit lines;

one of said first and second pairs of bit lines being coupled to said sense amplifier by one of said first and second switching means when one of said memory cells on said one pair of bit lines is selected;

said one switching means decoupling said one pair of bit lines from sense amplifier as said sense amplifier senses data from said one memory cell;

whereby effective sensing of data in said memory cells is achieved without dummy cells where said bit line pairs are selectively coupled to said sense amplifier.

2. The DRAM defined by claim 1 including first and second restoring circuits coupled to said first and second pairs of bit lines, respectively.

3. The DRAM defined by claim 2 wherein said second pair of bit lines are selectively coupled to a pair of input/output lines.

4. The DRAM defined by claim 3 wherein said first and second restoring circuits are separately activated.

5. The DRAM defined by claim 4 wherein when data is being sensed from one of said first cells, said second switching means decouples said second pair of bit lines from said sense amplifier and after said one memory cell is selected, said first switching means decouples said first pair of bit lines from said sense amplifier.

6. The DRAM defined by claims 4 or 5 wherein when data is being sensed from one of said second cells, said first switching means first decouples said first pair of bit lines from said sense amplifier, and subsequently said second switching means decouples said second pair of bit lines from said sense amplifier after said one of said second cells has been selected.

7. The DRAM defined by claim 6 wherein said precharging means for precharging said pairs of bit lines together to one-half the power potential used by said DRAM.

8. The DRAM defined by claim 3 wherein said sense amplifier includes imbalanced capacitors and wherein a signal is applied to said imbalanced capacitors to adjust potentials on one of said pairs of bit lines to compensate for a parasitic change in potential on one of said bit lines which occurs when a word line is activated.

9. The DRAM defined by claims 3 or 8 wherein said sense amplifier is fabricated from transistors of a first conductivity type and said restoring circuits are fabricated from transistors of a second conductivity type.

10. The DRAM defined by claim 9 wherein said first conductivity type is p-type and said second conductivity type is n-type.

11. A metal-oxide-semiconductor (MOS) dynamic, random-access memory (DRAM) comprising:
first and second pairs of bit lines;
a plurality of memory cells coupled to said bit lines;
a sense amplifier;
multiplexing means for selectively coupling one of said first and second pairs of bit lines to said sense amplifier, said multiplexing means coupled to said first and second pairs of bit lines and said sense amplifier;

first and second restoring means for selectively restoring potentials on said first and second pairs of bit lines, respectively during a read/restore cycle, said restoring means coupled to said pairs of bit lines;

said first and second restoring means being separately activated at different time sequence for restoring potentials on said first and second pairs of bit lines at different times;

whereby current peaks for said DRAM are reduced.

12. The DRAM defined by claim 11 wherein both said restoring means are deselected for writing into said DRAM.

13. The DRAM defined by claim 11 wherein said sense amplifier is fabricated from devices of a first conductivity type and said restoring means are fabricated from transistors of a second conductivity type.

14. The DRAM defined by claims 11 or 13 including precharging means to precharge said pairs of bit lines to one-half the power supply potential used by said DRAM.

15. The DRAM defined by claim 14 wherein said first and second restoring means causes one line from said first pair of bit lines and one line from said second pair of bit lines to be charged to full power supply potential and the other line of said first and second pairs of bit lines to be coupled to ground and wherein said precharging means couples said lines together.

16. The memory defined by claim 13 wherein said first conductivity type is p-type and second type is n-type.

17. The DRAM defined by claim 11 wherein said second pair of bit lines are selectively coupled to complementary input/output lines.

18. The DRAM defined by claim 11 wherein said sense amplifier includes pairs of imbalanced capacitors which receive signals during sensing, said imbalanced capacitors providing compensation for parisitic coupling of signals bit lines.

19. A metal-oxide-semiconductor (MOS) dynamic, random-access memory (DRAM) comprising:
a first pair of bit lines;
a plurality of memory cells coupled to said first pair of bit lines;
a sense amplifier coupled to said first pair of bit lines, said sense amplifier including a pair of imbalanced capacitors which receive signals during sensing, said imbalanced capacitors providing compensation for parasitic coupling of signals to said first pair of bit lines;
restoring means for selectively restoring potentials on said first pair of bit lines during a read/store cycle, coupled to said first pair of bit lines; and
precharging means for precharging said bit lines to approximately ½ the power supply potential used by said DRAM;
whereby improved sensing of signals on said first pair of bit lines occurs.

20. The DRAM defined by claim 19 including a second pair of bit lines and multiplexing means for selectively coupling one of said first and second pairs of bit lines to said sense amplifier, said multiplexing means coupled to said first and second pairs of bit lines and said sense amplifier.

21. A metal-oxide-semiconductor (MOS) dynamic, random-access memory (DRAM) comprising:
a first pair of bit lines;

a plurality of memory cells coupled to said first pair of bit lines;

a sense amplifier coupled to said first pair of bit lines;

restoration means for selectively restoring potentials on said first pair of bit lines during a read/store cycle, said restoration means coupled to said bit lines, said restoration means applying a potential approximately equal to the power supply potential to one of said lines while coupling the other of said lines to ground potential;

precharge means for precharging said pair of bit lines to a potential approximately equal to one-half said power supply potential, said precharge means coupling said first pair of bit lines together during an active memory cycle, whereby a DRAM consuming less power is achieved.

22. The DRAM defined by claim 21 wherein said sense amplifier includes two pairs of imbalanced capacitors coupled to said sense amplifier and coupled to receive a signal during sensing, such that only one of said pairs of capacitors receive said signal during sensing to provide compensation for parasitic coupling to said bit lines.

23. The DRAM defined by claim 21 or claim 22 including a second pair of bit lines having a plurality of memory cells coupled to said second pair of bit lines, and multiplexing means for selectively coupling one of said first and second pair of bit lines to said sense amplifier, said multiplexing means coupled to said first and second pairs of bit lines and said sense amplifier.

* * * * *